United States Patent
Chen et al.

(10) Patent No.: US 8,081,425 B2
(45) Date of Patent: Dec. 20, 2011

(54) PORTABLE ELECTRONIC DEVICE AND TRANSFERRING METHOD OF CIRCUIT ELEMENT THEREOF

(75) Inventors: Hung-Hsiang Chen, Taipei (TW); Yang-Po Chiu, Taipei (TW)

(73) Assignee: ASUSTek Computer Inc., Taipei (TW)

(*) Notice: Subject to any disclaimer, the term of this patent is extended or adjusted under 35 U.S.C. 154(b) by 207 days.

(21) Appl. No.: 12/232,354

(22) Filed: Sep. 16, 2008

(65) Prior Publication Data
US 2009/0142477 A1 Jun. 4, 2009

(30) Foreign Application Priority Data

Nov. 30, 2007 (TW) ................. 96145748 A

(51) Int. Cl.
*H05K 5/00* (2006.01)
*H05K 7/00* (2006.01)
(52) U.S. Cl. .................. 361/679.01; 361/807; 361/809; 361/811; 361/812
(58) Field of Classification Search .......... 361/679.01, 361/728, 734, 748, 752, 760, 762, 807, 809, 361/811, 812
See application file for complete search history.

(56) References Cited

U.S. PATENT DOCUMENTS

| | | | |
|---|---|---|---|
| 6,396,444 B1 * | 5/2002 | Goward et al. ............... | 343/702 |
| 6,943,705 B1 * | 9/2005 | Bolender et al. ............. | 341/33 |
| 7,401,758 B2 | 7/2008 | Liang et al. | |
| 7,548,206 B2 * | 6/2009 | Hong ................. | 343/700 MS |
| 7,601,289 B2 * | 10/2009 | Hamano et al. ............. | 264/266 |
| 2007/0120289 A1* | 5/2007 | Hamano et al. ............. | 264/261 |
| 2008/0070393 A1* | 3/2008 | Miyairi et al. ............... | 438/585 |
| 2008/0224361 A1 | 9/2008 | Liang et al. | |

FOREIGN PATENT DOCUMENTS

| | | |
|---|---|---|
| EP | 1 457 301 A1 | 9/2004 |
| TW | 200514490 A | 4/2005 |
| TW | 200709494 A | 3/2007 |

OTHER PUBLICATIONS

Office Action of Foreign Counterpart Application by Taiwan Patent Office (Date: Jun. 23, 2011).

* cited by examiner

*Primary Examiner* — Anthony Haughton

(57) ABSTRACT

A portable electronic device and a transferring method of a circuit element thereof are provided. The portable electronic device comprises a main body and a circuit element. The main body has a shell and a control element by a print way. The circuit element is integrated with the shell by transferring and is electrically connected with the control element.

12 Claims, 5 Drawing Sheets

PORTABLE ELECTRONIC DEVICE AND TRANSFERRING METHOD OF CIRCUIT ELEMENT THEREOF

This application claims the benefit of Taiwan application Serial No. 96145748, filed Nov. 30, 2007, the subject matter of which is incorporated herein by reference.

BACKGROUND OF THE INVENTION

1. Field of the Invention

The invention relates in general to a portable electronic device and a transferring method of circuit element thereof, and more particularly to a portable electronic device having a circuit element integrated with its shell and a transferring method of circuit element thereof.

2. Description of the Related Art

With the advance in technology, portable electronic devices such as laptop computers, mobile phones, personal digital assistants (PDA), PDA phones or global positioning system (GPS) devices have become indispensible devices to modern people in their everyday life. Due to their portability, a user can conveniently use a portable electronic device to contact with others or to deal with data files.

However, in order to implement a portable electronic device to perform its various functions, such as the functions of receiving/sending messages, accessing data files or displaying images, the portable electronic device must be equipped with a certain amount of circuit elements such as a sensing element and a light emitting element. Conventionally, the circuit elements such as the sensing element and the light emitting element are manufactured ahead, and then the circuit elements are assembled in the portable electronic device. The light emitting element such as a light indicator is composed of many components such as light-emitting diodes (LEDs) and light pipes that are assembled onto a circuit board. The sensing element such as a touch pad must be first disposed or formed on a circuit board, and then the circuit board is assembled to the portable electronic device. The conventional method as disclosed above to manufacture the circuit elements in the portable electronic device has the following disadvantages.

Firstly, the manufacture of the circuit elements requires a large amount of components and materials. Therefore, the derived costs such as material cost and inventory management cost make it difficult to decrease product cost.

Secondly, many assembly procedures are required for assembling the circuit elements to an electronic device. The product cost is thus expensive due to the derived assembly time.

Thirdly, a large amount of assembly components makes it difficult to reduce produce size and the flexibility in product design is restricted. For example, if one of the circuit elements needs to be changed, the arrangement and connection regarding its surrounding elements need to be taken into consideration, hence reducing the flexibility in product design.

SUMMARY OF THE INVENTION

The invention is directed to a portable electronic device that integrates a circuit element on its shell and a transferring method of the circuit element thereof. By way of the transferring method such as an injection molding method or a hot stamping method, the circuit element is transferred onto the shell of the portable electronic device, not only saving a large amount of assembly components but also increasing the flexibility in product design.

According to a first aspect of the present invention, a portable electronic device is provided. The portable electronic device includes a main body and a circuit element. The main body has a shell and a control element. The circuit element is integrated with the shell by a print way transferring and is electrically connected with the control element.

According to a second aspect of the present invention, a transferring method of circuit element of a portable electronic device is provided. The transferring method of circuit element includes the following steps. Firstly, at least one circuit element is formed on a thin film, wherein the thin film and the circuit element form a transfer film. Then, the circuit element is transferred onto the shell via the transfer film, so that the circuit element is integrated with the shell.

By the transferring method of the invention, the circuit element is integrated with the shell, hence saving a large amount of assembly components, assembling procedures, and assembling labor time, so that the cost is reduced accordingly.

The invention will become apparent from the following detailed description of the preferred but non-limiting embodiments. The following description is made with reference to the accompanying drawings.

DETAILED DESCRIPTION OF THE INVENTION

First Embodiment

Figure 1:
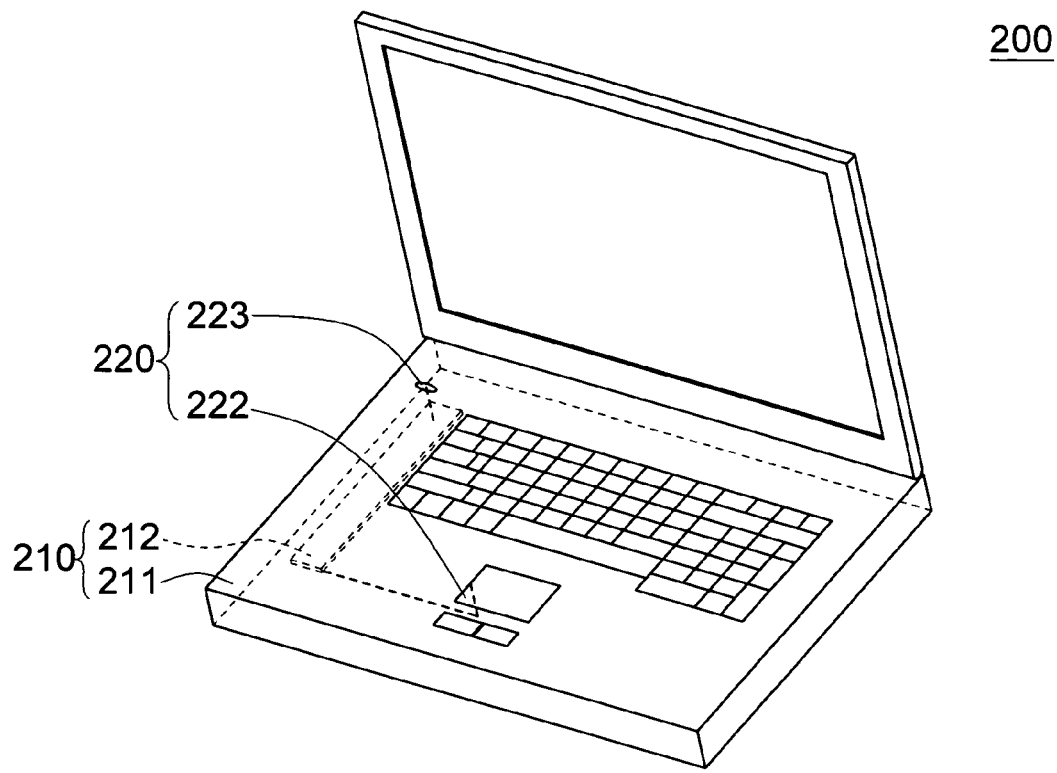
FIG. 1 shows a 3-D diagram of a portable electronic device according to a first embodiment of the invention.

Referring to FIG. 1, a 3-D diagram of a portable electronic device 200 according to a first embodiment of the invention is shown. The portable electronic device 200 includes a main body 210 and a circuit element 220. The main body 210 has a shell 211 and a control element 212, and the circuit element 220 is electrically connected with the control element 212. The circuit element 220 is integrated with the shell 211 as a whole by a transferring method. In the present embodiment of the invention, the circuit element 220 includes a sensing element 222 and a light emitting element 223. The sensing element 222 is, for example, a touch pad, and the light emitting element 223 is, for example, a light indicator.

Figure 2:
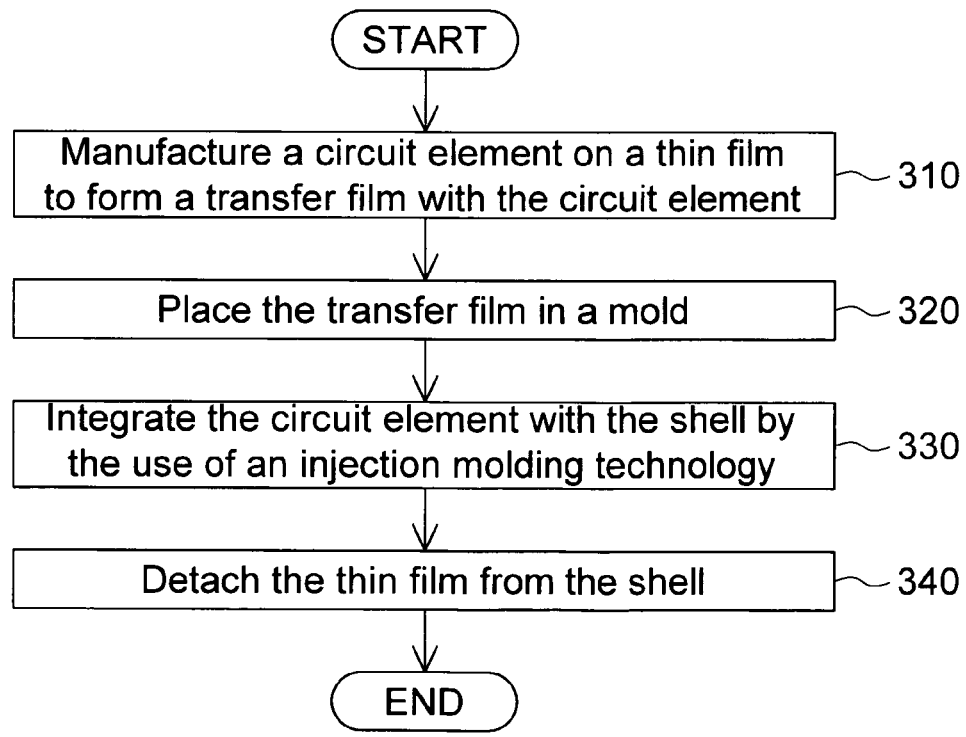
FIG. 2 shows a flowchart of a transferring method of circuit element.

FIG. 2 shows a flowchart of a transferring method of circuit element. The method begins at step 310, in which a circuit element is manufactured on a thin film to form a transfer film with the circuit element. In step 320, the transfer film is placed in a mold. In step 330, the circuit element and the shell are formed in one piece by the use of an injection molding technology. In step 340, the thin film is detached from the shell.

Figure 3:
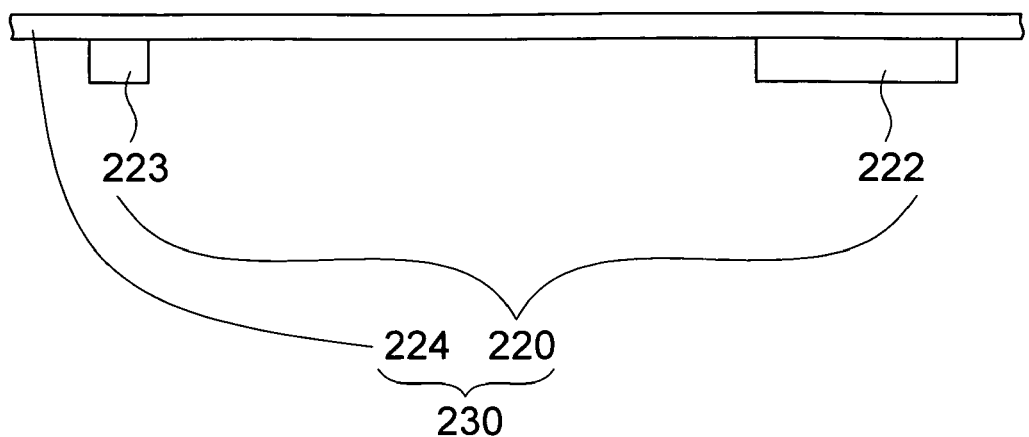
FIG. 3 shows a diagram illustrating the step 310 in FIG. 2 of forming a transfer film.

As shown in FIG. 3, which is a diagram illustrating the step 310 in FIG. 2 of forming a transfer film 230. After the circuit element 220 is manufactured on a thin film 224, the circuit element 220 forms the transfer film 230 with the thin film 224. Various layers of the circuit element 220 can be manufactured on the thin film 224 by, for example, printing, electroplating or depositing.

Figure 4A:
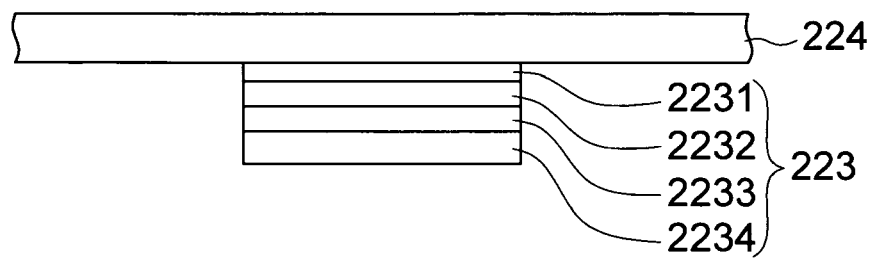
FIG. 4A is a structural diagram of the light emitting element in FIG. 1.
Figure 4B:
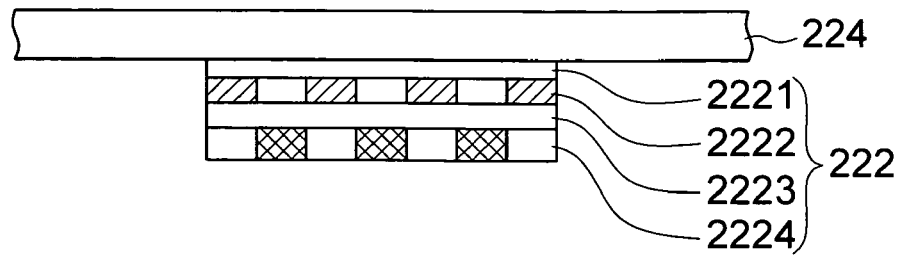
FIG. 4B is a structural diagram of the sensing element in FIG. 1.

FIG. 4A is a structural diagram of the light emitting element 223 in FIG. 1. FIG. 4B is a structural diagram of the sensing element 222 in FIG. 1.

As shown in FIG. 4A, the light emitting element 223 includes a protection layer 2231, a first electrode layer 2232, a light emitting layer 2233 and a second electrode layer 2234. The stated various layers are formed in the order disclosed below. Firstly, the protection layer 2231 is formed on the thin film 224. Next, the first electrode layer 2232 is formed on the protection layer 2231. Then, a light emitting layer 2233 is formed on the first electrode layer 2232. Afterwards, the second electrode layer 2234 is formed on the light emitting layer 2233. When a potential difference exists between the first electrode layer 2232 and the second electrode layer 2234 during the operation of the device, the light emitting layer 2233 emits a light beam. Thus, with the circuit element being integrated with the shell as a whole, there is no need to reserve a gap on the shell for the light emitting element, and no complicated circuits are assembled to the main body 210. The material of the light emitting layer 2233 has an electron luminescence (EL) property. The material of the first electrode layer 2232 is, for example, indium tin oxide, and the material of the second electrode layer 2234 is, for example, indium tin oxide, carbon or silver.

The protection layer 2231 is formed as the topmost layer of the light emitting element 223 to protect the light emitting element 223 from external damage such as erosion, wear and tear or infiltration of liquid after the thin film 224 is detached from the shell 211. The protection layer 2231 is, for example, made from an electro-insulating material to protect a user from electric shock. Preferably, the protection layer 2231 has at least one color, so that the whole device looks nicer and the circuit element can be recognized easily when the light emitting element 223 emits a light beam.

As shown in FIG. 4B, the sensing element 222 includes a protection layer 2221, a first conductive layer 2222, an insulating layer 2223 and a second conductive layer 2224. The stated various layers are formed in the order disclosed below. Firstly, the protection layer 2221 is formed on the thin film 224. Next, the first conductive layer 2222 is formed on the protection layer 2221. Then, the insulating layer 2223 is formed on the first conductive layer 2222. Afterwards, the second conductive layer 2224 is formed on the insulating layer 2223. The function of the protection layer 2221 is similar to that of the protection layer 2231 and is not repeated here. Preferably, an etching technology is used to form a first circuit pattern on the first conductive layer 2221 and a second circuit pattern on the second conductive layer 2224, so that the predetermined patterns of the sensing element 222 are formed.

Various layers of the circuit element in FIG. 4A and FIG. 4B are formed in a top-down order. However, the order of formation of the layers is not limited to the top-down order or bottom-up order. Any sequences capable of forming circuit elements that function normally can also be followed.

Figure 5A:
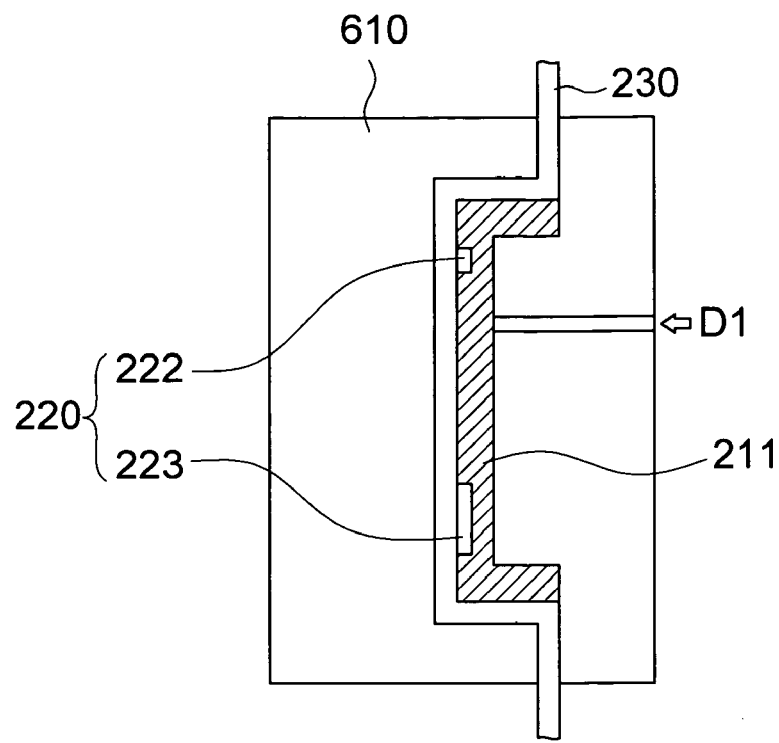
FIG. 5A is a diagram showing the step 320 and step 330 in FIG. 2.

FIG. 5A is a diagram showing the step 320 and step 330 in FIG. 2. In step 320, the transfer film 230 is placed in a mold 610. In step 330, a melted material of the shell 211 such as plastic is injected into the mold 610 along a D1 direction according to an injection molding technology. After the temperature of the material of the shell 211 goes down and the material solidifies, the circuit element and the shell 211 are formed in one piece.

Figure 5B:
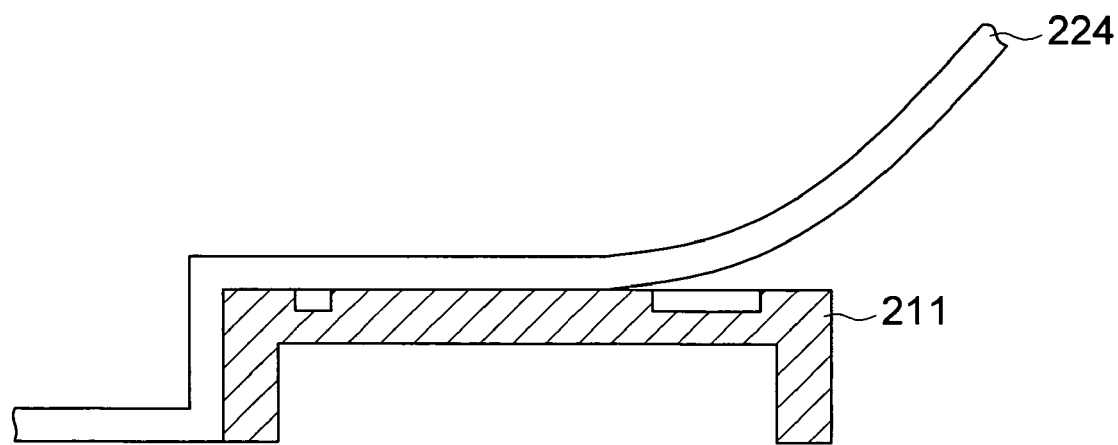
FIG. 5B is a diagram showing the step 340 in FIG. 2 of detaching a thin film from a shell.

Then, referring to FIG. 5B, it is a diagram showing the step 340 in FIG. 2 of detaching the thin film 224 from the shell 211.

Figure 6:
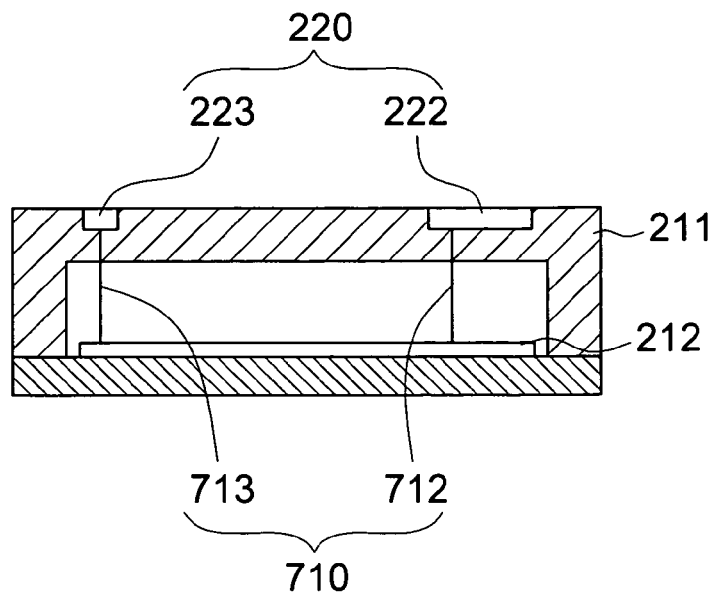
FIG. 6 is a diagram showing a connecting element electrically connected to the control element and the circuit element.

Referring to FIG. 6, it is a diagram showing a connecting element 710 electrically connected to the control element 212 and the circuit element 220. The connecting element 710 includes, for example, two connecting elements 712 and 713. The connecting element 713 is for electrically connecting the light emitting element 223 with the control element 212. The connecting element 712 is for electrically connecting the sensing element 222 with the control element 212. The connecting element 710 is, for example, a metallic elastic piece or a conductive epoxy.

Figure 7:
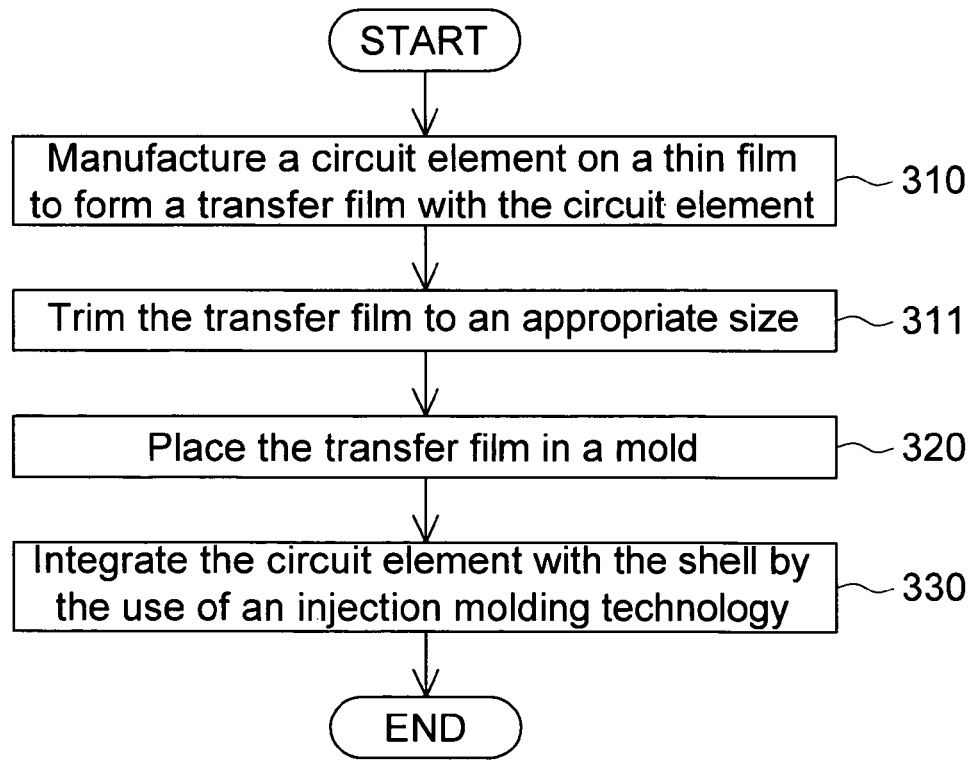
FIG. 7 shows a flowchart of another transferring method of circuit element of the portable electronic device.
Figure 8:
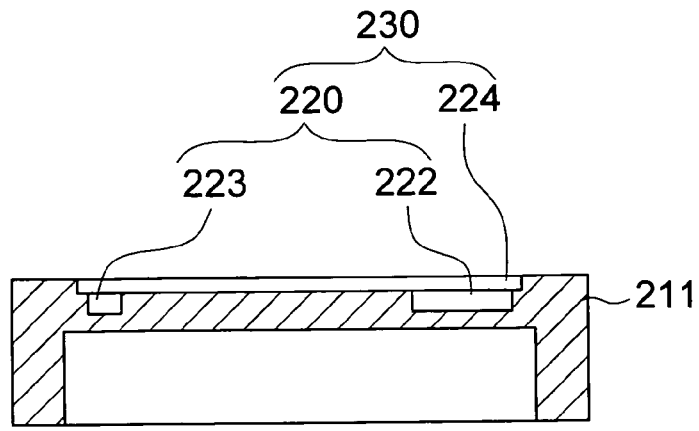
FIG. 8 shows a formation diagram of another transferring method of circuit element.

FIG. 7 shows a flowchart of another transferring method of circuit element of the portable electronic device. FIG. 8 shows a formation diagram of another transferring method of circuit element. In step 340 of the above present embodiment, the thin film 224 is detached from the shell. However, the thin film 224 is reserved on the shell 211 in the transferring method of circuit element in FIG. 7. As shown in FIG. 7, step 311 is added between step 310 and step 320 of FIG. 2. In step 311, the transfer film 220 is trimmed to an appropriate size. As the size of the transfer film 220 fits the predetermined size of the shell 211, the thin film 224 can be reserved on the shell 211 without having to be detached.

As shown in FIG. 8, the thin film 224 with appropriate size is reserved on the shell 211. The thin film 224 located on the top surface of the circuit element 220 and the shell 211, hence providing protection to the circuit element 220 and the shell 211.

In conventional method, the sensing element is installed inside the device and is subjected to the arrangement of its surrounding components. As such, the size of the sensing element is restricted, hence limiting its sensing area. However, according to the method of the invention, the sensing element can be formed on any surface of the shell, so the sensing area of the sensing element can be determined based on the actual requirement. In addition, since the circuit element is directly formed on the shell, a large amount of assembly components is saved. In terms of the light emitting element, components such as LEDs and light pipes are not used, hence reducing assembly time and component cost.

The portable electronic device in the present embodiment of the invention is exemplified by a laptop computer, however, the invention is not limited thereto. The portable electronic device can also be a mobile phone, PDA, PDA phone or GPS device.

The surface contour of the shell is not limited to a plane, and a curvature contour would also do. After the melted material of the shell filled the cavity of the mold having a curvature contour and then cooled and solidified, the circuit element will be transferred onto the shell having the curvature contour.

Second Embodiment

Figure 9:
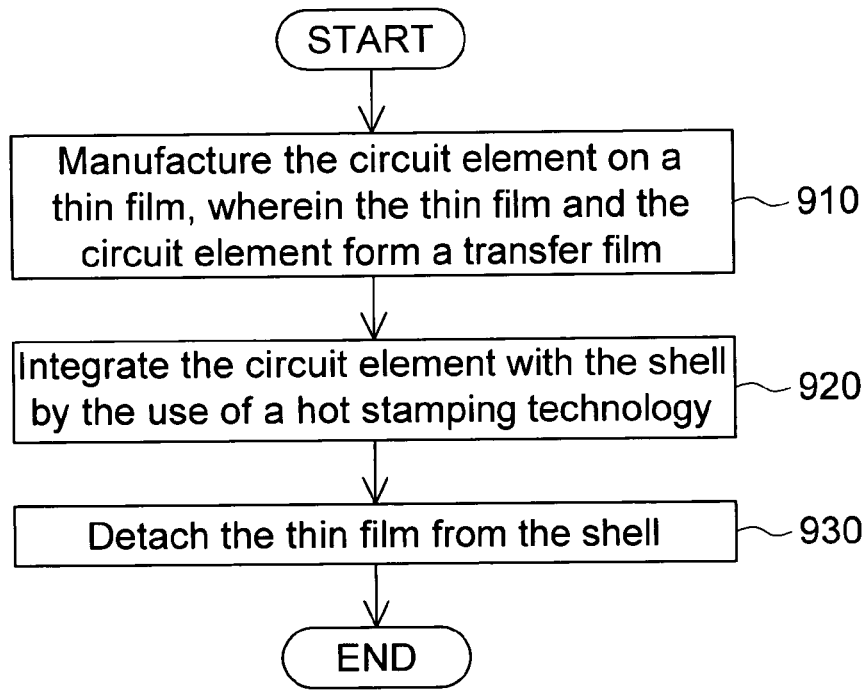
FIG. 9 shows a flowchart of a transferring method of circuit element according to a second embodiment of the invention.

FIG. 9 shows a flowchart of a transferring method of circuit element according to a second embodiment of the invention.

The present embodiment of the invention is different from the first embodiment since a hot stamping technology is used in the embodiment to form the circuit element. As shown in FIG. 9, in step 910, the circuit element is manufactured on a thin film, such that the thin film forms a transfer film with the circuit element. In step 920, the circuit element is integrated with the shell by the use of a hot stamping technology so that the circuit element and the shell are formed in one piece. In step 930, the thin film is detached from the shell.

Figure 10:
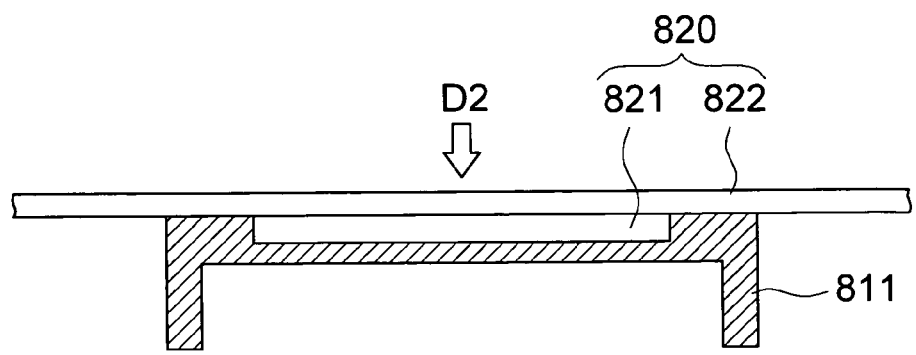
FIG. 10 is a diagram illustrating the step 920 in FIG. 9 of transferring a circuit element onto the shell by the use of a hot stamping technology.

Referring to FIG. 10, it is a diagram illustrating the step 920 in FIG. 9 of transferring the circuit element 821 onto the shell 811 by the use of a hot stamping technology. In step 920, according to the hot stamping technology, a heat and a pressure are generated and uniformly applied to the transfer film 820 along a direction D2 for stamping the circuit element 821 onto the shell 811. As for other steps similar to the steps disclosed above are not repeated again.

The portable electronic device and the transferring method of circuit element thereof disclosed in the above embodiments of the invention have advantages partially mentioned below.

A large amount of assembly components can be left out, hence saving many assembly procedures, assembly time and cost. The time and cost of inventory management are also reduced. The design of the circuit elements can be changed by changing their layer structure on the thin film alone regardless of the space restriction and arrangement of the surrounding components, hence increasing the flexibility in product design. Moreover, the elements transferred onto the shell such as the sensing element or the light emitting element look like being pasted on the surface of the shell, not only providing visual attraction but also reducing product size. Additionally, as any shell surface can be used as a base of the circuit element, the functional area of the circuit element becomes larger than that of the conventional device. For example, a touch pad can be integrated at any location of the shell surface of a laptop computer, so that the sensing area of the touch pad is not limited.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A portable electronic device, comprising:
   a main body having a shell and a control element; and
   a circuit element integrated with the shell by a print way, the print way is to form a transfer film with the circuit element on a thin film, then the transfer film is integrated with the shell as a whole, wherein the circuit element is electrically connected with the control element, and a protection layer formed between the circuit element and the thin film for protecting the circuit element.

2. The portable electronic device according to claim 1, wherein the thin film is removed after the transfer film is integrated with the shell as a whole.

3. The portable electronic device according to claim 1, wherein the transfer film is integrated with the shell as a whole by placing the transfer film in a mold, forming the shell in the mold according to an injection molding technology, and combining the shell with the transfer film.

4. The portable electronic device according to claim 1, wherein the transfer film is integrated with the shell as a whole by providing heat for the transfer film to form the circuit element on the shell.

5. The portable electronic device according to claim 1, wherein the circuit element is a sensing element.

6. The portable electronic device according to claim 5, wherein the sensing element comprises:
   a first conductive layer;
   a second conductive layer; and
   an insulating layer located between the first conductive layer and the second conductive layer.

7. The portable electronic device according to claim 1, wherein the circuit element is a light emitting element.

8. The portable electronic device according to claim 7, wherein the light emitting element comprises:
   a first electrode layer;
   a second electrode layer; and
   a light emitting layer located between the first electrode layer and the second electrode layer;
   wherein, the light emitting layer emits a light beam when a potential difference exists between the first electrode layer and the second electrode layer.

9. The portable electronic device according to claim 1, wherein the material of the shell is plastic.

10. The portable electronic device according to claim 1, wherein the shell has at least one surface whose contour is either a plane or a curvature.

11. The portable electronic device according to claim 1, further comprising:
    a connecting element for electrically connecting the circuit element with the control element.

12. The portable electronic device according to claim 11, wherein the connecting element is either a metallic elastic piece or a conductive epoxy.

* * * * *